(12) United States Patent
Tosuke

(10) Patent No.: US 9,997,503 B2
(45) Date of Patent: Jun. 12, 2018

(54) COMPOSITE SUBSTRATE AND LIGHT EMITTING DEVICE

(71) Applicant: NICHIA CORPORATION, Anan-shi, Tokushima (JP)

(72) Inventor: Hideaki Tosuke, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/666,971

(22) Filed: Aug. 2, 2017

(65) Prior Publication Data
US 2018/0040595 A1 Feb. 8, 2018

(30) Foreign Application Priority Data

Aug. 3, 2016 (JP) ................................ 2016-153270
Jun. 9, 2017 (JP) ................................ 2017-114589

(51) Int. Cl.
*H01L 25/13* (2006.01)
*H01L 33/62* (2010.01)
*H01L 33/48* (2010.01)

(52) U.S. Cl.
CPC ............ *H01L 25/13* (2013.01); *H01L 33/486* (2013.01); *H01L 33/62* (2013.01)

(58) Field of Classification Search
CPC ........ H01L 25/13; H01L 33/486; H01L 33/62
See application file for complete search history.

(56) References Cited

U.S. PATENT DOCUMENTS

| 4,959,761 A * | 9/1990 | Critelli .................. F21V 19/002 257/99 |
| 7,939,848 B2 * | 5/2011 | Kim ..................... H01L 25/0753 257/100 |
| 9,093,621 B2 * | 7/2015 | Kasae ..................... F21V 21/00 |
| 2007/0187709 A1 | 8/2007 | Yamamoto |
| 2010/0171144 A1 | 7/2010 | Kong et al. |
| 2011/0070673 A1 | 3/2011 | Yamamoto |

FOREIGN PATENT DOCUMENTS

| JP | 2007-207986 A | 8/2007 |
| JP | 2007-258495 A | 10/2007 |
| JP | 2010-530635 A | 9/2010 |

* cited by examiner

*Primary Examiner* — Fernando L Toledo
*Assistant Examiner* — Neil Prasad
(74) *Attorney, Agent, or Firm* — Hunton Andrews Kurth LLP

(57) ABSTRACT

The composite substrate includes: a lead frame including one or more pairs of support leads, each of the one or more pairs of support leads including a first support lead and a second support lead; and one or more packages supported by first and second support leads and including a resin molded body. The resin molded body includes: a first outer side surface; a second outer side surface; a third outer side surface; a fourth outer side surface; a front surface; a first recess; a second recess; a third recess disposed at a bottom surface of the first recess; and a fourth recess disposed at a bottom surface of the second recess. The first support lead is fitted into the first recess and the third recess, and the second support lead is fitted into the second recess and the fourth recess.

17 Claims, 6 Drawing Sheets

COMPOSITE SUBSTRATE AND LIGHT EMITTING DEVICE

CROSS-REFERENCE TO RELATED APPLICATIONS

This application claims priority to Japanese Patent Application No. 2016-153270, filed on Aug. 3, 2016, and Japanese Patent Application No. 2017-114589, filed on Jun. 9, 2017, the contents of which are hereby incorporated by reference in their entireties.

BACKGROUND OF THE INVENTION

Field of the Invention

The present disclosure relates to a composite substrate and more particularly, to a composite substrate for a light emitting device and a light emitting device using the same.

Description of the Related Art

In recent years, planar light sources are employed for backlights for liquid crystal display devices. Such a planar light source includes a thin light emitting device and a light guide plate for spreading light from the light emitting device in a plane. A thin light emitting device that includes a light emitting diode disposed in a flat and thin resin housing (i.e., housing) is known as one example of the light emitting devices for use in such an application (see, for example, JP 2010-530635 W).

SUMMARY OF THE INVENTION

In the above-described JP 2010-530635 W, a lead frame includes a support portion. A housing is supported by the support portion while manufacturing a light emitting device, and then the support portion is removed from the housing.

While using the above-mentioned lead frame, a bending force or impact is applied to the housing at the time of cutting the lead frame, bending the lead frame along the housing, pulling a hanger lead from the housing, handling the completed light emitting device, or the like. This may cause breakage of the housing.

A composite substrate according to one embodiment of the present invention comprises: a plate-shaped lead frame comprising one or more pairs of support leads, each of the one or more pairs of support leads including a first support lead and a second support lead; and a plurality of packages respectively supported by the first support lead and the second support lead, each of the one or more package including a resin molded body, wherein the resin molded body includes: a first outer side surface, a second outer side surface opposite to the first outer side surface, a third outer side surface between the first outer side surface and the second outer side surface, a fourth outer side surface opposite to the third outer side surface, a front surface adjacent to the first outer side surface, the second outer side surface, the third outer side surface, and the fourth outer side surface, a mounting recess in which a light emitting element is to be mounted, the mounting recess open at a front surface side, a first recess open at the first outer side surface and the third outer side surface but not open at the fourth outer side surface, a second recess open at the second outer side surface and the third outer side surface but not opened at the fourth outer side surface, a third recess defined in a bottom surface of the first recess at a first outer side surface side, and a fourth recess disposed at a bottom surface of the second recess at a second outer side surface side, and wherein the first support lead is fitted into the first recess and the third recess, and the second support lead is fitted into the second recess and the fourth recess.

A light emitting device according to one embodiment of the present invention comprises: a light emitting element; a plate-shaped lead frame including a first support lead and a second support lead; and a package supported by the first support lead and the second support lead, the package including a resin molded body, wherein the resin molded body includes: a first outer side surface, a second outer side surface opposite to the first outer side surface, a third outer side surface between the first outer side surface and the second outer side surface, a fourth outer side surface opposite to the third outer side surface, and a front surface adjacent to the first outer side surface, the second outer side surface, the third outer side surface, and the fourth outer side surface, a mounting recess open at a front surface side, the light emitting element mounted in the mounting recess, a first recess open at the first outer side surface and the third outer side surface but not open at the fourth outer side surface, a second recess open at the second outer side surface and the third outer side surface but not opened at the fourth outer side surface, a third recess defined in a bottom surface of the first recess at an first outer side surface side, and a fourth recess defined in a bottom surface of the second recess at a second outer side surface side.

In the above-described composite substrate and light emitting device, breakage of a package can be prevented.

DETAILED DESCRIPTION OF THE INVENTION

An embodiment of the present invention will be described below with reference to the accompanying drawings as appropriate. Note that a composite substrate and a light emitting device to be described below are intended to embody the technical idea of the present invention and are not intended to limit technical scope the present invention unless otherwise specified. Furthermore, the size, positional relationship, and the like of members shown in each drawings maybe exaggerated to clarify the description.

A composite substrate 1 and a light emitting device 100 according to the first embodiment will be described in detail below.

Figure 1:
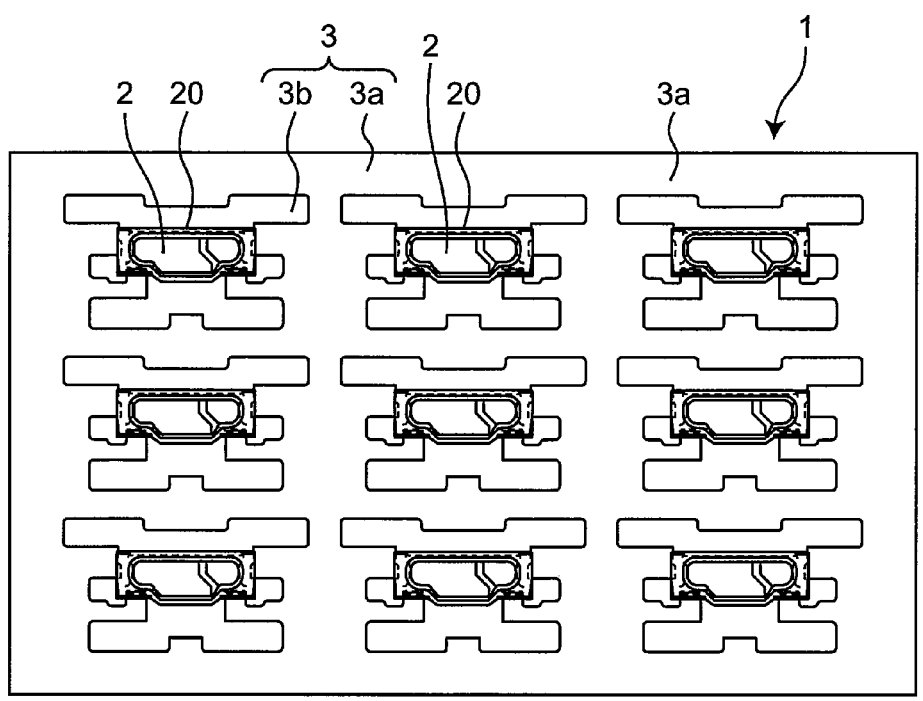
FIG. 1 is a schematic front view of a composite substrate according to the first embodiment.

FIG. 1 is a schematic front view of the composite substrate 1 according to the first embodiment. As shown in FIG.

1, the composite substrate 1 includes a lead frame 3 and a plurality of resin molded bodies 20.

The lead frame 3 includes a frame body 3a and a plurality of openings 3b. Portions of the composite substrate 1 where the resin molded bodies 20 are formed respectively corresponds to each of packages 2, which will be described below. Each of portions corresponding to the packages 2 is hereinafter referred to as a "unit region".

Figure 2A:
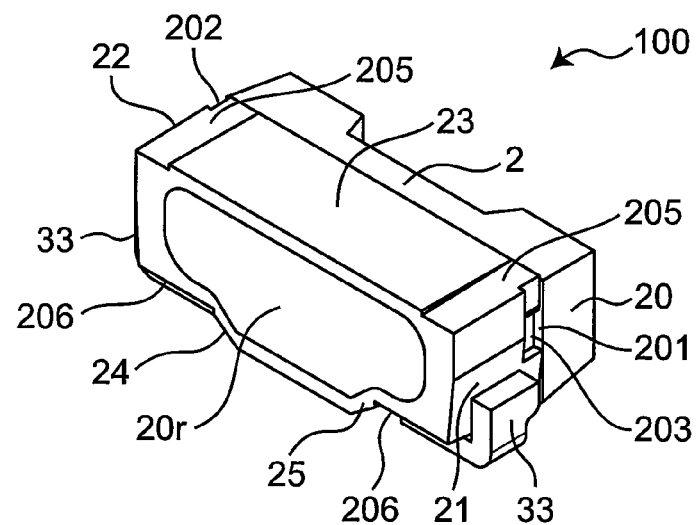
FIG. 2A is a schematic perspective view of a light emitting device according to the first embodiment.
Figure 2B:
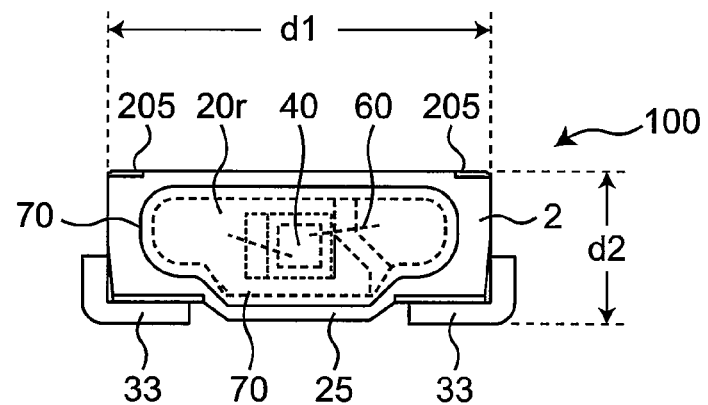
FIG. 2B is a schematic front view of a light emitting device according to the first embodiment.
Figure 2C:
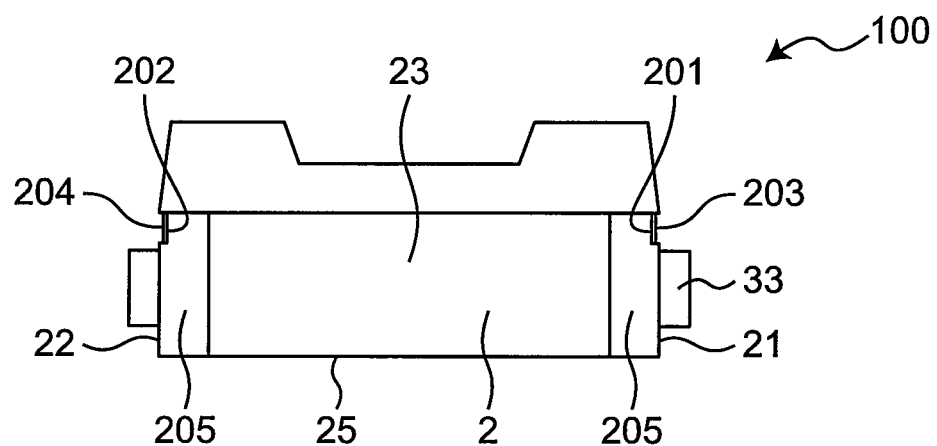
FIG. 2C is a schematic top view of a light emitting device according to the first embodiment.
Figure 2D:
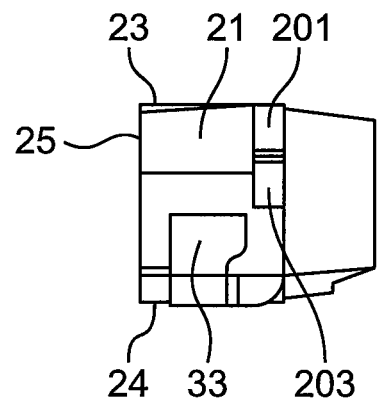
FIG. 2D is a schematic side view of a light emitting device according to the first embodiment.

FIG. 2A is a schematic perspective view of the light emitting device 100 according to the first embodiment; FIG. 2B is a schematic front view of the light emitting device 100 shown in FIG. 2A; FIG. 2C is a schematic top view of the light emitting device 100; and FIG. 2D is a schematic side view of the light emitting device 100. In FIG. 2B, parts covered by a sealing member 70 is represented by a dashed line. As shown in FIGS. 2A to 2D, the light emitting device 100 includes the package 2, a light emitting element 40 disposed at the package 2, wires 60, and the sealing member 70. The package 2 includes the resin molded body 20 and a plurality of electrode leads 33. The resin molded body 20 has at least the following surfaces: a first outer side surface 21; a second outer side surface 22 opposite to the first outer side surface 21; a third outer side surface 23 between the first outer side surface 21 and the second outer side surface 22; a fourth outer side surface 24 opposite to the third outer side surface 23; and a front surface 25 adjacent to the first outer side surface 21, the second outer side surface 22, the third outer side surface 23, and the fourth outer side surface 24. Further, the resin molded body 20 includes: a mounting recess 20r that is open on a front surface 25 side in which the light emitting element 40 are mounted; a first recess 201 in the first outer side surface 21; a second recess 202 in the second outer side surface 22; a third recess 203 in the bottom surface of the first recess 201; and a fourth recess 204 in the bottom surface of the second recess 202. The first recess 201 is open at the first outer side surface 21 and the third outer side surface 23, and is not open at the fourth outer side surface 24. Of surfaces defining the first recess 201, surfaces facing the opening in the first outer side surface 21 is referred to as the "bottom surfaces of the first recess 201" in the present specification. The second recess 202 is open at the second outer side surface 22 and the third outer side surface 23 and is not open at the fourth outer side surface 24. Of surfaces defining the second recess 202, surfaces facing the opening in the second outer side surface 22 is referred to as the "bottom surfaces of the second recess 202". The third recess 203 is defined at the bottom surfaces of the first recess 201. The fourth recess 204 is defined at the bottom surfaces of the second recess 202. A portion of each of the plurality of electrode leads 33 is embedded in the resin molded body 20 and the other portion thereof exposed from the outer side surface of the resin molded body 20. The light emitting element 40 is mounted on a surface of one of the plurality of electrode leads 33 exposed at the bottom surface of the mounting recess 20r. The wires 60 electrically connect the light emitting element 40 to the plurality of electrode leads 33. The sealing member 70 is charged into the mounting recess 20r of the resin molded body 20.

Figure 3A:
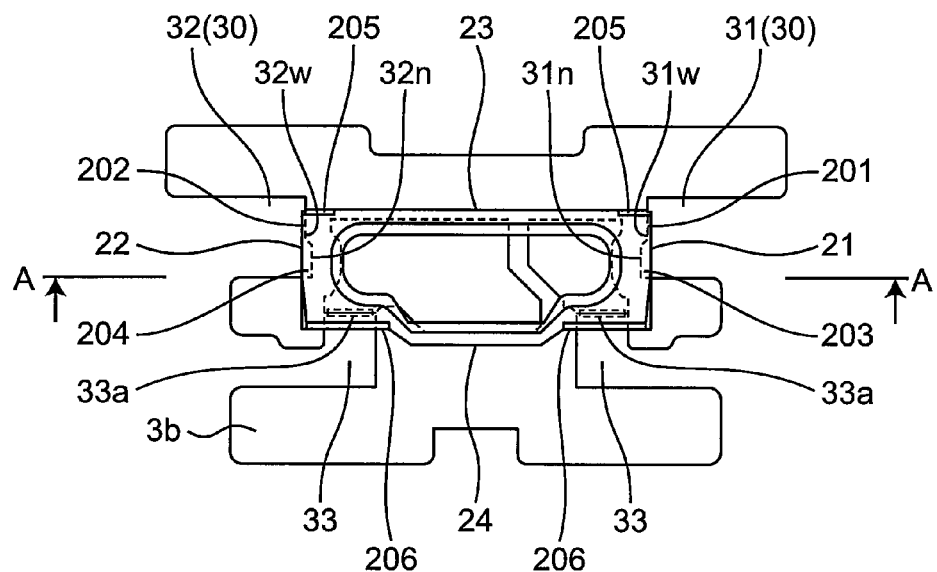
FIG. 3A is an enlarged view of a part shown in FIG. 1.
Figure 3B:
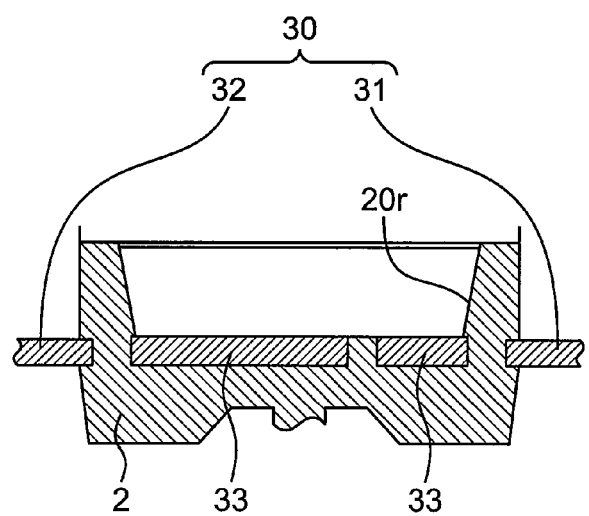
FIG. 3B is a schematic cross-sectional view of the composite substrate taken along the line A-A of FIG. 3A.
Figure 3C:
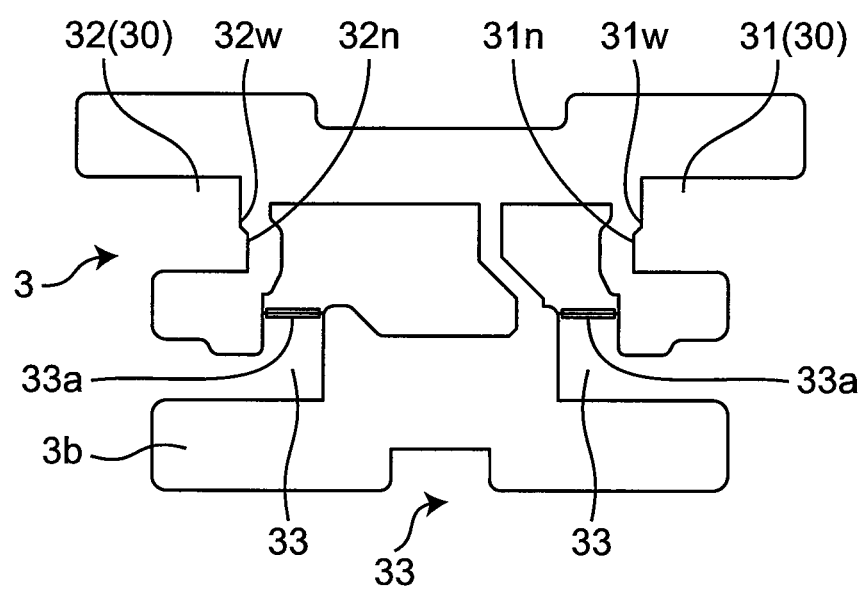
FIG. 3C is a schematic top view of a lead frame according to the first embodiment.

FIG. 3A is a schema tic partially enlarged front view of the composite substrate 1 according to the first embodiment, specifically, showing an enlarged view of one of unit regions in the composite substrate 1. FIG. 3B is a cross-sectional view taken along the line A-A of FIG. 3A. FIG. 3C is a schematic partially enlarged front view of the lead frame 3 in one of the unit regions according to the first embodiment.

Figure 3D:
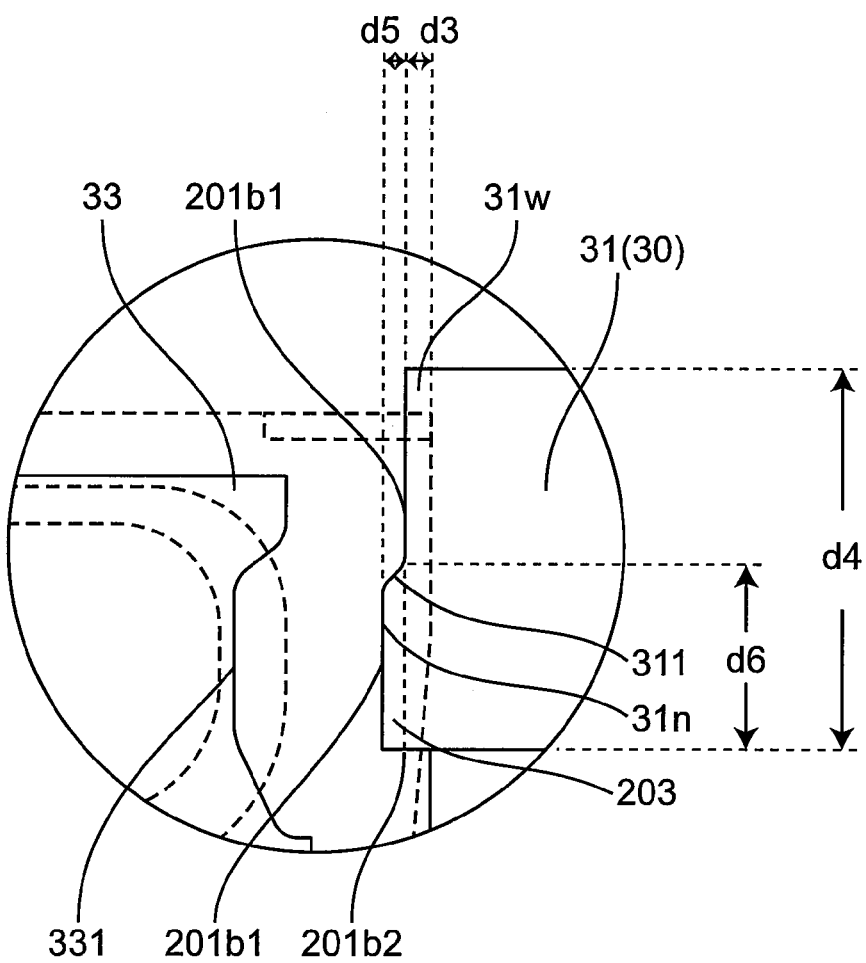
FIG. 3D is an enlarged view of a part shown in FIG. 3A.

FIG. 3D is an enlarged view of a part shown in FIG. 3A seen through the resin molded body 20. The resin molded body 20 is indicated by dashed lines.

As shown in FIGS. 3A, 3B, and 3C, the lead frame 3 has the plate shape. The lead frame 3 includes, for example, the plurality of electrode leads 33 and a pair of support leads 30 in each unit region. The electrode leads 33 are parts of the package 2, and are disposed in the resin molded body 20. The electrode leads 33 are used, for example, to supply power to the light emitting element 40. Support lead 30 is a portion adapted to support the resin molded body 20 (package 2) during a manufacturing of the light emitting device 100.

In the description below, the structure of the composite substrate 1 and a method of manufacturing the light emitting device 100 with the composite substrate 1.

Lead Frame 3

The lead frame 3 in the present embodiment includes a frame body 3a having the support leads 30 and the electrode leads 33 respectively provided in each of the unit regions. The support leads 30 are provided in each of the unit regions to support the resin molded body 20 in respective one of the unit regions. More specifically, as shown in FIG. 3A, in each of the unit regions, the lead frame 3 has an opening 3b such that the support leads 30 and the electrode leads 33 are formed in each unit region. The resin molded body 20 is formed such that, in the opening 3b, a portion of each of the electrode leads 33 is embedded in the resin molded body 20 and the resin molded body 20 is held by the support leads 30.

In the lead frame 3 according to the present embodiment, a plurality of openings 3b is formed in a matrix as shown in FIG. 1. In other words, in the composite substrate 1, the unit regions are formed in a matrix.

The lead frame 3 can be produced by press-forming (including punching) a plate made of metal, such as copper, aluminum, gold, silver, tungsten, iron, nickel, cobalt, or molybdenum, or an alloy thereof. Instead of the press-forming (including punching), etching may be performed to produce the lead frame 3.

The lead frame 3 can have an appropriate thickness in accordance with the properties or productivity of a light emitting device to be obtained. For example, the thickness of the lead frame is 0.05 mm or more and 1 mm or less.

In the case of manufacturing a package for a thin light emitting device, the thickness of the lead frame is, for example, preferably 0.07 mm or more and 0.3 mm or less, and more preferably 0.1 mm or more and 0.2 mm or less. The lead frame 3 may have the substantially uniform thickness across the entirety of the lead frame 3 or alternatively may have portions varied in thickness. When the lead frame has portions varied in thickness, a portion of each of the electrode lead 33 to be bent along the resin molded body 20 is preferably thinned. With this arrangement, each of the electrode leads 33 can be easily bent, so that distortion of the lead frame 3 can be reduced. As described below, a groove, irregularities, or the like may be formed in a surface of the lead frame 3.

Support Lead 30

After molding the resin molded body 20, the support leads 30 are fitted into the recess of the resin molded body 20 and supports the package 2. Each of the support leads 30 may have a thickness selected from the substantially same range as that of the lead frame 3.

For example, the thickness of the support lead 30 is preferably in a range of 0.10 mm to 0.20 mm. If each of the support leads 30 has a great thickness, the support leads 30 can firmly support the package 2, but fitting between the support leads 30 and the package 2 is not easily released. Meanwhile, if each support lead 30 has a small thickness, fitting between the support leads 30 and the package 2 can be easily released, but distortion is more likely to occur in the lead frame 3. Therefore, an appropriate thickness of the support lead 30 is preferably selected in view of a process that is performed in a state where the resin molded body 20 is supported by the support leads 30 after molding the resin molded body 20.

In order to support the resin molded body 20, for example, at two portions, i.e., both ends of the resin molded body, the support leads 30 include a first support lead 31 and a second support lead 32. The first support lead 31 has a wide portion 31w serving as a main body, and a narrow portion 31n protruded from the wide portion 31w at an end thereof. The second support lead 32 has a wide portion 32w serving as a main body, and a narrow portion 32n protruded from the wide portion 32w at an end thereof. After molding the resin molded body 20, an end portion of the wide portion 31w (i.e., a portion of a main body, which is portion of the resin molded body 20 excluding the narrow portion 31n, with a length of d3 from an end of the main body) is fitted into the first recess 201, and the narrow part 31n is fitted into the third recess 203, so that the first support lead 31 supports the resin molded body 20 at an end side of the resin molded body 20. Further, an end portion of the wide portion 32w (i.e., a portion of a main body, which is portion of the resin molded body 20 excluding the narrow part 32n) is fitted into the second recess 202, and the narrow part 32n is fitted into the fourth recess 204, so that the second support lead 32 supports the resin molded body 20 from the other end side.

Each of the wide portions 31w and 32w may have a width narrower than or equal to, but may preferably have a width wider than that of respective one of the first recess 201 and the second recess 202 to be fitted, as illustrated in FIG. 3A. This arrangement allows for effectively reducing the possibility that the package 2 detached from the support lead 30.

The narrow portion 31n preferably has a width that allows for being fitted into the third recess 203, for example, a width substantially equal to that of the third recess 203, into which the narrow portion 31n is to be fitted, The narrow portion 32n preferably has a width that allows for being fitted into the third recess 203 or the fourth recess 204, for example, a width substantially equal to that of the third recess 203 or the fourth recess 204, into which the narrow portion 32n is to be fitted. This arrangement allows for more firmly holding the package 2.

As shown in FIG. 3D, the wide portion 31w and the narrow portion 31n may be connected to each other via a side inclined with respect to a side of an end of the wide portion 31w and the narrow portion 31n (i.e., side denoted by reference numeral 311 in FIG. 3D), and the wide portion 32w and the narrow portion 32n may be connected to each other via a side inclined with respect to a side of an end of the wide portion 32w and the narrow portion 32n. Alternatively, respective wide portion and respective narrow portion may be connected to each other via a curve. A corner defined by the side of the wide portion 31w at an end thereof and the side connecting the wide portion 31w and the narrow portion 31n, and a corner defined by the side of the narrow portion 31n at an end thereof and the side connecting the wide portion 31w and the narrow portion 31n may be rounded. Also, a corner defined by the side of the wide portion 32w at an end thereof and the side connecting the wide portion 32w and the narrow portion 32n, and a corner defined by the side of the narrow portion 32n at an end thereof and the side connecting the wide portion 32w and the narrow portion 31n may be rounded. This allows for reducing the possibility of breakage of the resin molded body 20 at portions near the narrow portions 31n and 32n. Meanwhile, the wide portion 31w and the narrow portion 31n may be connected to each other via a side that forms a right angle or an acute angle with respect to the side the wide portion 31w at an end thereof and the narrow part 31n at an end thereof, and the wide portion 32w and the narrow portion 32n may be connected to each other via a side that forms a right angle or an acute angle with respect to the side the wide portion 32w at an end thereof and the narrow part 32n at an end thereof. With this arrangement, the support lead 30 can more firmly support the resin molded body 20 (package 2).

In the front view, a side of each of the narrow parts 31n and 32n is preferably continuous with respect to a side of corresponding one of the wide parts 31w and 32w. In the present embodiment, as shown in FIG. 3D, the surfaces of the narrow portions 31n and 32n are continuous with the wide portions 31w and 32w, respectively, which face the bottom surface on a side of the third outer side surface of respective recess. With this arrangement, respective recess into which corresponding one of the narrow portions 31n and 32n and corresponding one of the wide portions 31w and 32w is fitted can have a simple shape. Thus, the resin molded body 20 can be easily molded, and no corner is formed within the recess, which allows for reducing the possibility that the resin molded body 20 is broken when the package 2 is removed from the support lead 30.

A surface of each of the support leads 30 preferably has irregularities. In particular, each of the support leads 33 may have irregularities at portions corresponding to one or more of bottom surfaces at the first outer surface side, a surface closer to the front surface, and a surface closer to the back surface of each of the first recess 201 and the third recess 203. This arrangement allows for effectively reducing the possibility that the resin molded body 20 is detached from the support lead 30. Further, irregularities in a plurality of surfaces allows for enhancing such an effect.

In the case where each of the support leads 30 has one or more surfaces with irregularities, respective recess of the resin molded body 20 has one or more surfaces with irregularities that fit with the irregularities of corresponding one of the support leads 30. These irregularities of the resin molded body 20 can be easily formed by molding the resin molded body 20 so as to cover the end portion of each of the wide portions 31w and 32w and the narrow portions 31n and 32n after forming the irregularities of the support leads.

Electrode Lead 33

The electrode leads 33 constitute positive and negative terminals (electrodes) in the package 2. One package 2 includes at least a pair of electrode leads 33, but may alternatively include three or more electrode leads 33 thereof.

A plurality of or all of electrode leads 33 in each package 2 respectively include portions embedded in the resin molded body 20 and other portions exposed therefrom. The plurality of electrode leads 33 may be extended out from a plurality of outer surfaces of the resin molded body 20 facing in different directions. However, the plurality of electrode leads 33 is preferably extended out from a single outer surface of the resin molded body 20 facing in a single direction. In particular, the electrode leads are preferably extended out from the third outer side surface 23 or the fourth outer side surface 24. With this arrangement, the plurality of electrode leads 33 can be easily connected to external electrodes provided on amounting substrate or the like. In the present embodiment, the plurality of electrode leads is extended out from the fourth outer side surface 24 in which the first recess 201 and/or the second recess 202 are not formed. In the present embodiment, the electrode leads 33 are preferably extended out from the outer surfaces where the first recess 201 and the second recess 202 are not formed. As shown in FIG. 3A, in the case where a portion of the wide portion 31*w* of the support lead 30 is exposed from the third outer side surface 23 of the resin molded body 20, the electrode leads 33 are preferably extended out from a surface opposite to the third outer side surface 23, i.e., the fourth outer side surface 24. Thus, the distance between the support lead 30 and the electrode lead 33 can be increased in a state of the composite substrate 1, so that the lead frame 3 and the resin molded body 20 can be easily formed.

The electrode leads 33 may each have a thickness, which can be selected as appropriate, of, for example, 0.05 mm or more and 1 mm or less, preferably 0.07 mm or more and 0.3 mm or less, and more preferably 0.1 mm or more and 0.2 mm or less.

The electrode leads 33 are portions of the lead frame 3. For the electrode leads 33, a material similar to that used for the above-described lead frame 3 can be basically used. However, for example, for the purpose of preventing the sulfurization of silver at the surface of the electrode lead 33 or the like, an insulating coating may be provided or plating may be provided on a surface of the electrode lead 33. Such a process can be performed before or after separation from the frame body 3*a* of the lead frame.

In the case where the lead frame 3 has a plate shape, each of the support leads 30 is provided at a position that allows for facing the electrode lead 33 in the front view. With this arrangement, an amount or a thickness of a portion of the resin molded body 20 located between the support lead 30 and the electrode lead 33 may be reduced, which may cause breakage, defective molding, and the like of the corresponding portion of the resin molded body 20. In view of this, as shown in FIGS. 3C and 3D, in the front view, a recess 331 is preferably defined in the electrode lead 33 at a portion facing the support lead 30. In particular, a depression 331 is preferably formed at each of a portion facing the narrow portion 31*n* of the first support lead 31 and a portion facing the narrow portion 32*n* of the second support lead 32. Thus, the thickness of the resin molded body 20 can be secured, so that the possibility of the breakage, defective molding, and the like of the resin molded body 20 can be reduced.

Each electrode lead 33 may have at least one groove or recess. For example, as shown in FIGS. 3A and 3C, grooves 33*a* may be formed in each electrode 33 inside the resin molded body 20. Thus, the adhesion between the resin molded body 20 and the electrode lead 33 can be enhanced. A surface of the electrode lead exposed at the mounting recess 20*r* may have a groove or a recess. With this arrangement, an adhesive member and of the wire to be described below can be arranged easily. A portion of the resin molded body 20 exposed at the outside may have a groove or a recess. With this arrangement, the electrode lead 33 can be easily bent along the resin molded body 20 at the time of bending.

As in the present embodiment, the lead frame 3 may include a frame body 3*a* that connects the support leads 30 to the electrode leads 33 and supports the support leads 30 and the electrode leads 33. With this arrangement, the lead frame 3 can be easily handled, which allows easy manufacturing of the light emitting device 100.

When the resin molded body 20 is molded in each unit region of the lead frame 3 having a structure as described above, as shown in FIGS. 3A, 3B, and 3D, the electrode leads 33 are embedded in the resin molded body 20 as portions of the light emitting device 100. In this manner, the support leads 30 are fitted into the recesses (first to fourth recesses) of the resin molded body 20, thereby supporting the package 2. In more detail, the end portion and the narrow portion 31*n* of the first support lead 31 are fitted into the first recess 201 and the third recess 203 at the bottom surface of the first recess 201 in the resin molded body 20.

Further, the end portion and the narrow portion 31*n* of the second support lead 32 are fitted into the second recess 202 and the fourth recess 204 at the bottom surface of the second recess 202 in the resin molded body 20.

In the present embodiment, the support leads 30 are fitted into the recesses of the resin molded body 20 in such a manner.

Accordingly, the light emitting device 100 is manufactured in the manner as described below in a state where the package 2 is supported by the lead frame 3.

In each unit region, first, the light emitting element 40 is mounted in the recess 20*r* of the resin molded body 20.

Then, the light emitting element 40 is electrically connected to the electrode leads 33, and subsequently the sealing member 70 is charged into the recess 20*r*, thereby sealing the light emitting element 40.

Thereafter, the electrode leads 33 are cut in each unit region in a state where the resin molded body 20 is supported by the support leads 30.

Subsequently, the electrode leads 33 which have been cut out in each unit region are bent while the resin molded body 20 is supported by the support leads 30.

More specifically, a portion of one electrode lead 33 at a cut portion side (i.e., a portion extended to the outside of the first outer side surface 21) is bent to be oriented in parallel with the first outer side surface 21, while a portion of the other electrode lead 33 at a cut portion side (i.e., a portion extended to the outside of the second outer side surface 22) is bent to be oriented in parallel with the second outer side surface 22. Then, each of the one electrode lead 33 and the other electrode lead 33 is bent along with (i.e., so as to face) the fourth outer side surface 24 (i.e., bent toward upper side of FIG. 1). Alternatively, after the electrode leads 33 extended out of the fourth outside surface 24 are bent along with (i.e., so as to face) the fourth outer side surface 24, a portion of one electrode lead 33 at the cut portion side and a portion of the other electrode lead 33 at the cut surface side may be bent along (i.e., so as to face) the first outer side surface 21 and the second outer side surface 22, respectively.

Through the steps mentioned above, the light emitting device 100 supported by the support leads 30 is formed in each unit region of the composite substrate 1.

Finally, the fitting between the support leads 30 and the recesses of the resin molded body 20 is released by a method such as pressing the package 2, so that each light emitting device 100 is taken out from the frame body 3*a* of the lead frame 3 of the composite substrate 1.

As described above, in the manufacturing method of the light emitting device according to the present embodiment, the light emitting devices 100 are formed in the unit regions of the composite substrate 1 in a state where each resin molded body 20 is supported by the support leads 30, and then each light emitting device 100 is taken out from the frame body 3*a* of the lead frame 3 of the composite substrate 1. Therefore, the light emitting device can be manufactured efficiently.

However, when the light emitting device 100 is fabricated in a state where the resin molded body 20 is supported by the support leads 30 as described above, a stress is applied to portions of the resin molded body 20 that are supported by the support leads 30, in particular, to portions thereof near the first recess 201 and the second recess 202 in each step, which may lead to deformation or breakage of the resin molded body 20. In particular, when a portion of the electrode leads 33 at the cut portion side is bent along the first outer side surface 21 and the second outer side surface 22, a relatively large stress may be applied to the portions of the resin molded body 20 supported by the support leads 30.

In view of this, in the present embodiment, both of the first recess 201 in the first outer side surface 21 and the second recess 202 in the second outer side surface 22, which are fitted into the support leads 30, are respectively open at the third outer side surface 23. With this arrangement, the stress applied to the parts of the resin molded body 20 supported by the support leads 30 is reduced. This arrangement allows for preventing deformation of the resin molded body 20 and cracking or breakage of the resin molded body 20 at portions in the vicinity of the portions supported by the support leads 30, compared with the case in which both the first recess 201 and the second recess 202 are not opened at the third outer side surface 23. In the present embodiment, the third recess 203 is defined at the bottom surface of the first recess 201, and the narrow portion 31$n$ of the support lead 31 is fitted into the third recess 203.

Further, the fourth recess 204 is defined at the bottom surface of the second recess 202, and the narrow portion 32$n$ of the support lead 32 is fitted into the fourth recess 204. Thus, the resin molded body 20 is firmly supported by the support leads 30. In this way, in the composite substrate 1 of the present embodiment, both the first recess 201 and the second recess 202, into which the wide parts 31$w$ and 32$w$ of the support leads 30 are fitted, respectively, are open at the third outer side surface 23, thereby relieving the stress applied to the resin molded body 20.

Meanwhile, the narrow portions 31$n$ and 32$n$ are fitted into the third recess 203 defined at the bottom surface of the first recess 201 and the fourth recess 204 defined at the bottom surface of the second recess 202, thereby firmly supporting the resin molded body 20. In a structure in which the electrode leads 33 are protruded from the fourth outer side surface 24, and the first recess 201 and the second recess 202 are formed on the side of the third outer side surface 23, if the first recess 201 and the second recess 202 are not open at the third outer side surface 23, a thickness of a resin portion between the third outer side surface 23 and each of the first and second recesses 201 and 202 is reduced, which may increase the possibility of occurring cracking in this resin portion. However, such concern can be solved by the arrangement, as in the present embodiment, in which the first and second recesses 201 and 202 are open at the third outer side surface 23.

The first recess 201 and the second recess 202 respectively have a shape not open on a fourth outer side surface 24 side, which allows for reducing the possibility of detachment of the package 2 due to disengagement of the support leads 30 from the fourth outer side surface 24 side.

Meanwhile, the third recess 203 is defined in the bottom surface of the first recess 201, the fourth recess 204 is defined in the bottom surface of the second recess 202, and each the support leads 30 is fitted into respective ones of these recesses. This can reduce the possibility that the package 2 drops off the opening on the side of the third outer side surface 23. This arrangement allows for firmly holding the resin molded body 20. In the package 2, the support leads 30 are fitted into the first recess 201 and the second recess 202, as well as the third recess 203 and the fourth recess 204.

Thus, even if the third recess 203 and the fourth recess 204 has a small depth, the package 2 can be held sufficiently firmly.

As shown in FIG. 3D, in the composite substrate 1 of the present embodiment, the support leads 30 each with a great width can be used, which allows for reducing the distortion or the like of the support leads 30, so that the resin molded body 20 can be stably fixed to the lead frame 3. For this reason, using the composite substrate 1 according to the present embodiment allows for reducing possibility of breakage of the package 2. Furthermore, the light emitting device 100 can be easily manufactured.

The structure of respective components of the light emitting device according to one embodiment of the present invention, other than those described above, will be mainly described below.

Package 2

The package 2 is a container for housing the light emitting element 40, and includes terminals (electrodes) for supplying electricity to the light emitting element 40 from external components. The package 2 includes the resin molded body 20 and the electrode leads 33. The package 2 in the present embodiment is for use in a side-emitting type (also called a "side-view type") light emitting device in which the fourth outer side surface 24 adjacent to the front surface 25 serves as a mounting surface of the light emitting device 100.

Resin Molded Body 20

The resin molded body 20 serves as a base of the container in the package 2. The resin molded body 20 constitutes a portion of an outermost periphery of the package 2.

The resin molded body 20 is made of a material that contains resin as a base material, and formed to embed a portion of lead frame 3 therein.

The resin molded body 20 in the present embodiment has a back surface opposite to the front surface 25, as well as the first outer side surface 21, the second outer side surface 22, the third outer side surface 23, the fourth outer side surface 24, and the front surface 25, which are described above.

The resin molded body 20 has a shape of, for example, a substantially rectangular parallelepiped shape, or a similar shape thereto. For example, as shown in FIG. 2B, etc., the front surface 25 may have a rectangular shape that has a protrusion protruding toward the fourth outer side surface 24 side. When viewed from the third outer side surface 23 side, the back surface of the resin molded body 20 may have a trapezoidal recess. As shown in FIG. 2C, the first outer side surface 21 and the second outer side surface may be inclined such that a distance between the first outer side surface 21 and the second outer side surface is decreased toward the back surface side. Corners of the resin molded body 20 where a plurality of sides thereof are connected with each other may be rounded.

In the present specification, the expression that a first, second, third, or fourth outer side surface or front surface is "adjacent to" another one of these surfaces refers to not only the state where these surfaces are directly in contact, but also the state where another surface or a curved surface are interposed between these surfaces.

A maximum distance d1 between the first outer side surface and the second outer side surface (hereinafter sometimes referred to as a "lateral width of the light emitting device") is preferably, for example, in a range of approximately 2.5 mm to 4.8 mm.

A maximum distance d2 between the third outer side surface and the fourth outer side surface (hereinafter sometimes referred to as a height of the light emitting device) is, for example, in a range of 0.25 mm to 1.1 mm, preferably 0.3 mm to 0.8 mm, and more preferably 0.3 mm to 0.6 mm.

Mounting Recess 20r

The mounting recess 20r is open at the front surface 25 of the resin molded body 20. The light emitting element 40 is placed in the mounting recess 20r. The mounting recess 20r may have any appropriate shape, size, depth, and the like that allows the light emitting element 40, the wire 60, and the like to be arranged in the mounting recess 20r. For example, in the front view, the mounting recess 20r preferably has an ellipsoidal shape, a quadrilateral shape, or a similar shape thereto, with a length in the direction from the first outer side surface to the second outer side surface that is longer than that in the direction from the third outer side surface to the fourth outer side surface. This arrangement allows for increasing an area of a region from which the light emitted from the light emitting element 40 is extracted and increasing light extraction efficiency while reducing a thickness of the light emitting device 100. The mounting recess 20r preferably has the shape similar to that of the front surface 25 of the resin molded body 20. For example, in the light emitting device 100 of this embodiment, as shown in FIG. 2B, the resin molded body 20 and the mounting recess 20r respectively have a portion protruded toward the fourth outer side surface side. This arrangement allows for increasing the area of the region from which the emitted light is extracted and increasing the light extraction efficiency of the light emitting device 100.

For example, as shown in FIG. 3B, the inner wall of the mounting recess 20r is preferably inclined such that a width thereof is increased from the bottom surface of the mounting recess 20r toward the front surface of the resin molded body 20. Thus, the light emitted from the light emitting element 40 is reflected by the inner wall of the mounting recess 20r and thus can be efficiently extracted toward the front surface. In order to improve the adhesion to the sealing member 70 or the like, the inner wall of the resin molded body 20 configuring the mounting recess 20r may have irregularities formed by an embossing process, a plasma treatment, or the like, and may not partially or entirely have a uniform thickness, as long as the strength of the resin molded body 20 can be ensured.

A distance between the mounting recess 20r and the outer side surface of the resin molded body 20 (i.e., a thickness of a wall of the resin molded body 20) can be in a range of, for example, approximately 0.1 to 0.6 mm. With the wall having a thickness of approximately 0.1 mm in the direction between the third outer side surface 23 and the fourth outer side surface 24, reduction in thickness the light emitting device 100 can be achieved.

First Recess 201, Second Recess 202

The first recess 201 in the present embodiment is open at the first outer side surface 21 and the third outer side surface 23 and is not open at the fourth outer side surface 24.

The second recess 202 in the present embodiment is open at the second outer side surface 22 and the third outer side surface 23 and is not open at the fourth outer side surface 24.

In the present specification, a surface of the surfaces defining the first recess 201 opposite to the opening of the first recess 201 in the first outer side surface 21 (i.e., surface 201b1 shown in FIG. 3D) is referred to as "a bottom surface at the first outer side surface side" as appropriate. Similarly, a surface of the surfaces defining the first recess 201 opposite to the opening of the first recess in the third outer side surface 23 (i.e., surface 201b2 shown in FIG. 3D) is referred to as "a bottom surface at the third outer side surface side". The distance (distance d3 shown in FIG. 3D) between the first outer side surface 21 and the bottom surface at the first outer side surface side is referred to as "a depth of the first recess". The distance (distance d4 shown in FIG. 3D) between the third outer side surface and the bottom surface at the third outer side surface side is referred to as "a width d4 of the first recess". Likewise, a surface of the surfaces defining the second recess 202 opposite to the opening of the second recess 201 in the second outer side surface is referred to as "a bottom surface at the second outer side surface side". A surface of surfaces defining the second recess opposite to the opening of the second recess 202 in the third outer side surface is referred to as "a bottom surface at the third outer side surface side. The distance between the third outer side surface to the bottom surface at the third outer side surface side is referred to as "a width of the second recess".

The width of the first recess 201 and/or the width of the second recess 202 can be, for example, at approximately one-quarter to three-quarters of the height of the light emitting device 100. For example, when the height of the light emitting device 100 is 0.3 mm, the width of the first or second recess can be approximately 0.2 mm. For example, when the height of the light emitting device 100 is 0.8 mm, the width of the first or second recess may be approximately 0.20 mm to 0.3 mm. Thus, the package 2 can be sufficiently firmly held by the support leads 30. In view of reducing the distortion of the lead frame 3, the first recess 201 and/or second recess 202 is preferably great, and for example, is preferably set at a half or more of the height of the light emitting device 100.

The depth of the first recess 201 and/or the depth of the second recess 202 can be in a range of, for example, approximately 0.02 mm to 0.08 mm, and more preferably approximately 0.03 mm to 0.05 mm.

A shape of the first recess 201 and a shape of the second recess 202 are preferably symmetrical with respect to the center line of the package 2 in view of stable holding of the package 2.

Alternatively, the first recess 201 and the second recess 202 may each have different shapes to each other. The first recess 201 or the second recess 202 may be provided at either one of the outer side surfaces of the package 2.

Third Recess 203, Fourth Recess 204

The third recess 203 is defined in the bottom surface 201b1 at the first outer side surface side, in the first recess 201. The fourth recess 204 is defined in the bottom surface on the second outer side surface side, in the second recess 202.

In the present specification, a surface of the surfaces defining the third recess 203 opposite to the opening at the first outer side surface 23 side (i.e., surface 203b1 shown in FIG. 3D) is referred to as a "bottom surface at the third outer side surface side" as appropriate. Similarly, a surface of the surfaces defining the third recess 203 opposite to the opening at the third outer side surface 23 side (i.e., surface 203b2 shown in FIG. 3D) is referred to as the "bottom surface at the third outer side surface side". The distance between an end portion (i.e., opening) of the third recess 203 and the bottom surface at the first outer side surface side (i.e., distance d5 shown in FIG. 3D) is referred to as a "depth of the third recess". Similarly, a distance between a surface of the surfaces defining the third recess 203 closer to the third outer side surface 23, and a surface of the surfaces defining the third recess 203 closer to the fourth outer side surface 24 (i.e., distance d6 shown in FIG. 3D) is referred to as a "width of the third recess". Similarly, a surface of the surfaces defining the fourth recess 204 opposite to the second outer side surface 22 is referred to as a "bottom surface at the second outer side surface side". A surface of the surfaces defining the fourth recess 204 opposite to the third outer side surface 23 is referred to as a "bottom surface at the third outer side surface side". The distance between an end portion of the fourth recess 204 and the bottom surface at the second outer side surface side is referred to as a "depth of the fourth recess". The distance between a surface of the surfaces defining the fourth recess 204 closer to the third outer side surface 23, and a surface of the surfaces defining the fourth recess 204 closer to the fourth outer side surface 24 is referred to as a "width of the fourth recess 204".

The depth of the third recess 203 and/or the depth of the fourth recess 204 can be preferably in a range of, for example, approximately 0.02 mm to 0.04 mm.

The width of each of the third recess 203 and/or the width of the fourth recess 204 is preferably in a range of, for example, approximately one-fifth to one-third of the height of the package 2. The width of the third recess 203 and/or the width of the fourth recess 204 is preferably in a range of, for example, approximately one-fifth to three-fifths of the width of the first recess 201 and/or second recess, respectively. Thus, the package 2 can be held sufficiently firmly.

The bottom surface at the first outer side surface side, of the third recess 203 and/or the bottom surface at the first outer side surface side, of fourth recess 204 preferably have irregularities to be described below in order to suppress the detachment of the package from the support leads 30.

A shape of the third recess 203 and a shape of the fourth recess 204 are preferably symmetrical with respect to the center line of the package 2 in view of stable holding of the package 2. Alternatively, a shape of the third recess 203 and a shape the fourth recess 204 may be different from, each other. The package 2 may include either one of the third recess 203 or the fourth recess 204.

Fifth Recess 205

The resin molded body may include one or more fifth recesses 205 that are open at the third outer side surface 23. In the present embodiment, the resin molded body includes two fifth recesses 205.

One of the two fifth recesses 205 is located adjacent to the first recess 201 and is open at the third outer side surface 23. The other of the fifth recesses 205 is located adjacent to the second recess 202 and is open at the third outer side surface 23. The fifth recesses 205 may serve as, for example, an inclined part for easily removing the resin molded body 20 from a mold or as a marker indicating the polarity of the light emitting device 100.

The expression "adjacent to the first recess 201" in the present specification refers to the state of being located in the vicinity of the first recess 201. More specifically, one of the fifth recesses 205 at the first recess, 201 side may have an opening continuous to the first recess 201, that is, may be open also at the first recess 201 side. Alternatively, one of the fifth recesses 205 at the first recess 201 may be spaced apart from the first recess 201, i.e., may not be open at the first outer side surface 21 side. With one of the fifth recesses 205 at the first recess 201 continuous to the first recess 201, the resin molded body 20 can be easily molded, and the walls of the resin molded body 20 can be prevented from having thin portion, which can reduce the possibility of breakage of the package 2. The expression that "each the fifth recesses 205 is adjacent to the second recess 202" refers to a relationship similar to the relationship between each of the fifth recesses 205 and the above-described first recess 201.

Sixth Recess 206

The resin molded body 20 may include one or more sixth recesses 206 that are open at the fourth outer side surface 24.

In the present embodiment, the resin molded body 20 includes two sixth recesses 206.

One of the two sixth recesses 206 is adjacent to the first recess 201 and is open at the fourth outer side surface 24. The other of the sixth recesses 206 is adjacent to the second recess 202 and is open at the fourth outer side surface 24. As shown in FIG. 2B, the sixth recesses 206 may each serve as a space in which the electrode lead 33 extended from the fourth outer side surface 24 is bent or the like and accommodated.

The expression "adjacent to the first recess 201" in the present specification refers to the state of being provided in the vicinity of the first recess 201. More specifically, one of the sixth recesses at the first recess 201 side may have an opening continuous to the first recess 201, that is, may open also on the side of the first recess 201. Alternatively, one of the sixth recess at the first recess 201 side may be spaced apart from the first recess 201, i.e., may not be open at the side of the first outer side surface 21. With one of the sixth recesses 206 at the first recess 201 side continuous to the first recess 201, the resin molded body 20 can be easily molded, and the walls of the resin molded body 20 can be prevented from having thin portion, which allows for reducing the possibility of breakage of the package 2. The expression that "the sixth recess 206 is adjacent to the second recess 202" refers to a relationship similar to the relationship between the sixth recess and the above-mentioned first recess 201.

For the base material of the resin molded body 20, for example, a thermosetting resin or a thermoplastic resin can be used. Note that examples of the resins described below include modified resins thereof and hybrid resins thereof. A thermosetting resin good resistance to heat and light, a long lifetime, and high reliability, compared to the thermoplastic resin, and thus is preferably used. Examples of such a thermosetting resin include an epoxy resin, a silicone resin, a polybismaleimide triazine resin, a polyimide resin, a polyurethane resin, and an unsaturated polyester resin. Among them, either one of an epoxy resin, a silicon resin, and an unsaturated polyester resin is preferable. In particular, the unsaturated polyester resin, and modified resin and hybrid resin thereof can be molded using an injection molding method while having good resistance to heat and light, which is inherent in the thermosetting resin, and are good in productivity, and thus is preferably used. More specifically, examples of the resin include those mentioned in JP 2013-153144 A, JP 2014-207304 A, and JP 2014-123672 A, which are incorporated herein by reference. Alternatively, for the base material of the resin molded body, a thermoplastic resin is also preferable because of its low price compared with that of the thermosetting resin. Examples of the thermoplastic resin include an aliphatic polyamide resin, a semi-aromatic polyamide resin, an aromatic polyphthalamide resin, polycyclohexylenedimethylene terephthalate, polyethylene terephthalate, polycyclohexane terephthalate, liquid crystal polymers, and a polycarbonate resin. Among them, either one of an aliphatic polyamide resin, polycyclohexane terephthalate, and polycyclohexylenedimethylene terephthalate is preferable. The resin molded body 20 preferably contains a while pigment and a filler, to be described below, in view of the light reflectivity, the mechanical strength, the thermal stretchability, and the like.

Some thermosetting resins, such as unsaturated polyester resins and epoxy resins, have properties that are preferable for use as the resin molded body of the above-mentioned light emitting device, but may have lower viscosity than the thermoplastic resins and may have low bending resistance, such as a flexural modulus of, for example, approximately 10 GPa or more. In view of this, at the time of pressing the package 2 to remove the package 2 from the composite substrate 1 or handling the light emitting device 100, a portion of the package 2 may have cracks or the like, which may increase the possibility of breakage of the package 2. Nevertheless, with the present embodiment, the breakage of the package 2 can be effectively prevented while using such a resin.

If the material of the resin molded body 20 has a small strength, the possibility of breakage of the resin molded body 20 may be increased. In view of this, a great effect can be obtained from the present embodiment, in particular in the case where the flexural modulus of the material for the resin molded body 20 is approximately 8 GPa or more, 10 GPa or more, and 16 GPa or more.

In the case where the light emitting device 100 has a small thickness, for example, with a height of approximately 0.3 mm, the strength of the light emitting device may be reduced due to a thin wall of the resin molded body 20, which may increase the possibility of breakage of the package 2. In view of this, even in the case where the resin molded body 20 is made of a thermoplastic resin having a flexural modulus of approximately 5 GPa, a great effect can be obtained from the present embodiment, particularly in the case where the light emitting device 100 has a small thickness.

In the resin molded body 20, an optical reflectance at an emission peak wavelength of the light emitting element 40 is preferably 70% or more in view of improvement in the light extraction efficiency of the light emitting device 100. Further, the resin molded body 20 is preferably white. The resin molded body 20 may be in a state of having fluidity, i.e., a liquid state (including a sol state or a slurry state) before being hardened or solidified. The resin molded body 20 can be molded, for example, by the injection molding method, a transfer molding method, or the like.

The resin molded body preferably contains a white pigment and/or a reinforcing agent. This arrangement allows for enhancing the strength of the resin molded body, thereby reducing the possibility of the breakage thereof.

Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. For the white pigment, one of these materials can be used alone, or two or more of these materials can be used in combination. Among them, titanium oxide has a relatively high refractive index and good light shielding properties, and thus is preferable.

Examples of the filler include silicon oxide, aluminum oxide, glass, potassium titanate, calcium silicate (wollastonite), mica, and talc. For the filler, one of these materials can be used alone, or two or more of these materials can be used in combination. The filler is made of a material different from that of the white pigment mentioned above. In particular, for an agent for reducing the coefficient of thermal expansion of the resin molded body 20, silicon oxide (that preferably has a grain size of 5 μm or more and 100 μm or less and more preferably 5 μm or more and 30 μm or less) is preferably used. Glass, potassium titanate, and calcium silicate (wollastonite) are preferably used for the reinforcing agent. Among them, calcium silicate (wollastonite) or potassium titanate has a relatively small diameter and thus is suitable for a thin or small-sized resin molded body 20. More specifically, an average fiber diameter of the reinforcing agent, which can be selected as appropriate, is, for example, in a range of 0.05 μm or more and 100 μm or less, preferably 0.1 μm or more and 50 μm or less, more preferably 1 μm or more and 30 μm or less, and still more preferably 2 μm or more and 15 μm or less. An average fiber length of the reinforcing agent, which can be selected as appropriate, is, for example, in a range of 0.1 μm or more and 1 mm or less, preferably 1 μm or more and 200 μm or less, more preferably 3 μm or more and 100 μm or less, and still more preferably 5 μm or more and 50 μm or less. An average aspect ratio (i.e., average fiber length/average fiber diameter) of the reinforcing agent, which can be selected as appropriate, is, for example, in a range of 2 or more and 300 or less, preferably 2 or more and 100 or less, more preferably 3 or more and 50 or less, and still more preferably 5 or more and 30 or less. The filler may have any appropriate shape, and may be in an amorphous form (i.e., crushed form), but preferably has a fibrous (i.e., needle-like) shape or a plate-like (i.e., scale-like) shape in view of the function of the reinforcing agent, or preferably a spherical shape in view of the fluidity. The content of the filler in the resin molded body 20 can be selected as appropriate in view of a thermal expansion coefficient and a mechanical strength of the resin molded body 20, and the like. The content of the filler in the resin molded body 20 is preferably 10 wt % or more and 80 wt % or less, and more preferably 30 wt % or more and 60 wt % or less. Among the filler, the content of the reinforcing agent is preferably 5 wt % or more and 30 wt % or less, and more preferably 5 wt % or more and 20 wt % or less.

Material or the Like of Lead Frame 3

For the lead frame 3, a material easy to handle during manufacturing of the lead frame 3 or the light emitting device 100 and suitable for the leads 33 of the light emitting device 100 is preferably used.

Examples of a base material of the lead frame 3, a plate member obtained by performing various processes, such as press-forming (including punching), etching, rolling, etc., onto a plate made of metal, such as copper, aluminum, gold, silver, tungsten, iron, nickel, cobalt, or molybdenum, or an alloy thereof. The lead frame 3 may be a layered body made of two or more of these metals or alloys, but is preferably a single layer because of its simplicity. In particular, a copper alloy containing copper as a main component (phosphor bronze, copper containing iron, etc.) has good heat dissipation and electrical conductivity, and thus is preferable.

A light reflective film, made of silver, aluminum, rhodium, gold, or an alloy thereof, is preferably disposed on a surface of the lead frame 3, particularly on a surface of a portion of the lead frame exposed at the bottom surface of the mounting recess 20r for serving as the electrode leads 33, in view of improving the light extraction efficiency of the light emitting device 100. Among them, silver or a silver alloy has good light reflectivity, and thus is preferable. In particular, a film (for example, plated film) made of silver or a silver alloy using a sulfur-based brightener has a smooth surface and has greatly high light reflectivity, and thus is preferable. Sulfur and/or a sulfur compound in the brightener is dispersed in crystal grains and/or crystal grain boundaries of silver or a silver alloy (the sulfur content is, for example, 50 ppm or more and 300 ppm or less). A glossiness of the light reflective film, which can be selected as appropriate, is preferably 1.5 or more, and more preferably 1.8 or more. The glossiness is a value measured by using a digital densitometer Model 144, manufactured by GAM (Graphic Arts Manufacturing Co.).

A plated layer of silver, a silver alloy, etc., described above, is preferably disposed on a surface of the support lead 33. This arrangement allows for protecting the base material of the support leads 33, which can reduce rust and deterioration of the support leads 33, so that a force holding the package 2 can be maintained.

Light Emitting Element 40

For the light emitting element 40, a semiconductor light emitting element, such as a light emitting diode (LED) element, can be employed. The light emitting element 40 may include a substrate in many cases, and includes at least an element structure made of various semiconductors and a positive and negative (pn) electrodes. In particular, a light emitting element using a nitride semiconductor ($In_xAl_yGa_{1-x-y}N$, $0 \leq x$, $0 \leq y$, $x+y \leq 1$) and allows emission of light in a range of ultraviolet to visible region can be employed. Further, the light emitting element 40 may be a light emitting element made of a gallium arsenide-based or gallium phosphorus-based semiconductor that emits green to red light. In the case where the light emitting element 40 includes positive and negative electrodes on the same surface side, each of positive and negative electrodes is connected to respective one of the plurality of electrode leads 33 by the wires 60. Each of positive and negative may be connected to respective one the plurality of electrode leads 33 by a conductive adhesive member (flip-chip mounting). Meanwhile, in the case where the light emitting element 40 has an opposing-electrode structure in which each of positive and negative electrodes is provided on respective one of opposed surfaces, a bottom surface electrode is bonded to one of the electrode leads 33 with the conductive adhesive member, while a top surface electrode is connected to the other of the electrode leads 33 by the wire 60. The number of light emitting elements 40 mounted in each package 2 may be one or more. For example, three light emitting elements 40 that emit blue, green, and red lights, respectively, or two light emitting elements 40 that emit blue and green lights, respectively, may be mounted in each package 2.

Wires 60

Each of the wires 60 is a conductive wire that connects each of the electrodes of the light emitting element 40 to respective one of the electrode leads 33. The wires 60 can also be used to connect an electrode of a protective element 90 to the electrode lead 33. More specifically, a metal wire made of metal such as gold, copper, silver, platinum, aluminum, or palladium, or an alloy of two or more of these can be used.

Sealing Member 70

The sealing member 70 serves to seal the light emitting element 40 to protect the light emitting element 40 from dust, moisture, external force, or the like. With the sealing member 70, members such as the light emitting element 40 can be protected, which allows for enhancing the reliability of the light emitting device 100. The sealing member 70 is charged into the mounting recess 20r. The surface of the sealing member 70 may be substantially in the same plane with the front surface 25 of the resin molded body 20, or alternatively may be depressed with respect to the front surface 25. The sealing member 70 has electrically insulating properties and is light-transmissive with respect to light emitted from the light emitting element 40 (which preferably has a light transmittance of 60% or more with respect to an emission peak wavelength of the light emitting element 40). The sealing member 70 preferably contains at least a fluorescent substance in the base material, but is not limited thereto.

Examples of the base material of the sealing member 70 include a silicone resin, an epoxy resin, a phenol resin, a polycarbonate resin, an acrylic resin, TPX resin, polynorbornene resin, a modified resin of one or more of these, and a hybrid resin of two or more of these. Among them, in particular, a silicone-based resin (a silicone resin, a modified resin thereof, and a hybrid resin thereof) are preferable because of excellent resistance to heat and A silicone-based resin containing a phenyl group (methyl-phenyl silicone-based resin to diphenyl silicone-based resin) has relatively high heat resistance and gas barrier properties among silicone resins, and thus is preferable. The content of the phenyl group in all organic groups bonded to silicon atoms in the silicone-based resin that contains the phenyl group is, for example, 5 mol % or more and 80 mol % or less, preferably 20 mol % or more and 70 mol % or less, and more preferably 30 mol % or more and 60 mol % or less. The silicone-based resin containing the phenyl group has a relatively high hardness. Providing such a silicone-based resin in the mounting recess 20r allows for supporting the resin molded body 20. Accordingly the possibility of breakage of the resin molded body 20.

Fluorescent Substance

A fluorescent substance absorbs at least a portion of primary light emitted from the light emitting element 40 and emits secondary light with a wavelength different from that of the primary light. Accordingly, the light emitting device can be configured to emit a mixed color light (for example, white light) in which a color of the primary light and a color of the secondary light, which have visible light wavelength, can be obtained. These fluorescent substances, which will be exemplified, can be used alone or in combination. Specific examples of the phosphor adopted to emit light of green to yellow include an yttrium aluminum garnet based phosphor (e.g., $Y_3(Al,Ga)_5O_{12}$:Ce), a lutetium aluminum garnet based phosphor (e.g., $Lu_3(Al,Ga)_5O_{12}$:Ce), a silicate-based phosphor (e.g., $(Ba,Sr)_2SiO_4$:Eu), a chlorosilicate-based phosphor (e.g., $Ca_8Mg(SiO_4)_4Cl_2$:Eu), and a β-sialon-based phosphor (e.g., $Si_{6-z}Al_zO_zN_{8-z}$:Eu) ($0<Z<4.2$). Specific examples of the phosphor adopted to emit red light include a nitrogen-containing calcium aluminosilicate (CASN or SCASN) based phosphor (e.g., $(Sr,Ca)AlSiN_3$:Eu), and a potassium fluorosilicate-based phosphor, activated with manganese (e.g., $K_2SiF_6$:Mn). The fluorescent substance may contain quantum dots. Each of such quantum dots is a particle having a grain size of approximately 1 nm or more and 100 nm or less, and can have a emission wavelength in accordance with the grain size.

Examples of the filler for the sealing member 70 include silicon oxide, aluminum oxide, zirconium oxide, and zinc oxide. These fillers for the sealing member 70 can be used alone or in combination. In particular, silicon oxide is preferable as an agent for reducing the coefficient of thermal expansion of the sealing member 70.

Protective Element

The light emitting device 100 in the present embodiment may include the protective element 90 disposed in the recess 20r and electrically connected to the electrode leads 33. The protective element serves to protect the light emitting element 40 from static electricity or high voltage surge. More specifically, the protective element is, for example, a Zener diode (ZD). With the protective element, reliability of the light emitting device 100 can be increased.

Adhesive Member

The adhesive member bonds the light emitting element 40 or the protective element to the electrode lead 33. The adhesive member can also be used to bond the protective element to the electrode lead 33. Examples of an insulating adhesive member include an epoxy resin, a silicone resin, a polyimide resin, a modified resin of one or more of these, and a hybrid resin of two or more of these. Examples of a conductive adhesive member include a conductive paste made of silver, gold, palladium, etc., and tin-bismuth based, tin-copper based, tin-silver based, and gold-tin based solder.

Certain embodiments of the present invention have been described above, the structures described in the accompanied claims are not limited thereto.

The invention claimed is:

1. A composite substrate comprising:
   a plate-shaped lead frame comprising one or more pairs of support leads, each of the one or more pairs of support leads including a first support lead and a second support lead; and
   one or more packages respectively supported by the first support lead and the second support leads, each of the one or more packages including a resin molded body,
   wherein the resin molded body includes:
   a first outer side surface,
   a second outer side surface opposite to the first outer side surface,
   a third outer side surface between the first outer side surface and the second outer side surface,
   a fourth outer side surface opposite to the third outer side surface, and
   a front surface adjacent to the first outer side surface, the second outer side surface, the third outer side surface, and the fourth outer side surface,
   a mounting recess in which a light emitting element is to be mounted, the mounting recess open at the front surface side,
   a first recess open at the first outer side surface and the third outer side surface but not open at the fourth outer side surface,
   a second recess open at the second outer side surface and the third outer side surface but not open at the fourth outer side surface,
   a third recess disposed at a bottom surface of the first recess at the first outer side surface side, and
   a fourth recess disposed at a bottom surface of the second recess at the second outer side surface side, and
   wherein the first support lead is fitted into the first recess and the third recess, and the second support lead is fitted into the second recess and the fourth recess.

2. The composite substrate according to claim 1, wherein a width of the third recess and/or a width of the fourth recess is smaller than a width of the mounting recess.

3. The composite substrate according to claim 1, wherein the resin molded body further includes a fifth recess that is adjacent to the first recess and is open at the third outer side surface.

4. The composite substrate according to claim 1, wherein the lead frame includes a plurality of openings in each of which the resin molded body is disposed.

5. The composite substrate according to claim 1, wherein a maximum distance between the third outer side surface and the fourth outer side surface is in a range of 0.3 mm to 0.6 mm.

6. The composite substrate according to claim 1, wherein a resin material of the resin molded body is a thermosetting resin.

7. The composite substrate according to claim 1, wherein a flexural modulus of a material of the resin molded body is 10 GPa or more.

8. The composite substrate according to claim 1, wherein the resin molded body is made of an unsaturated polyester resin.

9. The composite substrate according to claim 1, wherein the resin molded body contains a white pigment and/or a reinforcing fiber.

10. The composite substrate according to claim 1, wherein the lead frame includes a plurality of electrode leads and a portion of each of the electrode leads is exposed at a bottom surface of the mounting recess.

11. The composite substrate according to claim 10, wherein the plurality of electrode leads is extended out from the fourth outer side surface.

12. A light emitting device comprising:
    a light emitting element;
    a plate-shaped lead frame including a first support lead and a second support lead; and
    a package supported by the first support lead and the second support lead, the package including a resin molded body,
    wherein the resin molded body includes:
    a first outer side surface,
    a second outer side surface opposite to the first outer side surface,
    a third outer side surface between the first outer side surface and the second outer side surface,
    a fourth outer side surface opposite to the third outer side surface,
    a front surface adjacent to the first outer side surface, the second outer side surface, the third outer side surface, and the fourth outer side surface,
    a mounting recess open at the front surface side, the light emitting element mounted in the mounting recess,
    a first recess open at the first outer side surface and the third outer side surface but not open at the fourth outer side surface,
    a second recess open at the second outer side surface and the third outer side surface but not opened at the fourth outer side surface,
    a third recess defined in a bottom surface of the first recess at the first outer side surface side, and
    a fourth recess defined in a bottom surface of the second recess at the second outer side surface side, and
    wherein the first support lead is fitted into the first recess and the third recess, and the second support lead is fitted into the second recess and the fourth recess.

13. The light emitting device according to claim 12, wherein a width of the third recess and/or a width of the fourth recess is smaller than a width of the mounting recess.

14. The light emitting device according to claim 12, wherein the resin molded body includes a fifth recess that is adjacent to the first recess and is open at the third outer side surface.

15. The light emitting device according to claim 12, wherein a resin material of the resin molded body is a thermosetting resin.

16. The light emitting device according to claim 12, wherein a flexural modulus of a material of the resin molded body is 10 GPa or more.

17. The light emitting device according to claim 12, wherein the resin molded body is made of an unsaturated polyester resin.

* * * * *